(12) United States Patent
Goriki et al.

(10) Patent No.: US 7,416,314 B2
(45) Date of Patent: Aug. 26, 2008

(54) DISCHARGE LAMP LIGHTING DEVICE AND ILLUMINATOR

(75) Inventors: Takeshi Goriki, Yawata (JP); Akihiro Kishimoto, Osaka (JP); Kenichi Fukuda, Hirakata (JP)

(73) Assignee: Matsushita Electric Works, Ltd., Osaka (JP)

( * ) Notice: Subject to any disclaimer, the term of this patent is extended or adjusted under 35 U.S.C. 154(b) by 209 days.

(21) Appl. No.: 10/562,217

(22) PCT Filed: Jan. 14, 2004

(86) PCT No.: PCT/JP2004/000213

§ 371 (c)(1),
(2), (4) Date: Feb. 6, 2006

(87) PCT Pub. No.: WO2005/001336

PCT Pub. Date: Jan. 6, 2005

(65) Prior Publication Data

US 2006/0164842 A1    Jul. 27, 2006

(30) Foreign Application Priority Data

Jun. 25, 2003    (JP) ............................ 2003-181147

(51) Int. Cl.
*F21V 23/02*    (2006.01)
(52) U.S. Cl. .................................................... 362/265
(58) Field of Classification Search ......... 362/263–265, 362/296–310; 439/699.2, 226, 76.1
See application file for complete search history.

(56) References Cited

U.S. PATENT DOCUMENTS 4,398,239 A * 8/1983 de Vos et al. ................ 362/263
5,939,674 A * 8/1999 Jibe et al. ..................... 174/59

FOREIGN PATENT DOCUMENTS

| JP | 53-110496 | 2/1978 |
|---|---|---|
| JP | 53-89075 | 12/1978 |
| JP | 61-120111 | 7/1986 |
| JP | 8-064026 | 3/1996 |
| JP | 9-282928 | 10/1997 |

OTHER PUBLICATIONS

English language Abstract of JP 8-064026.
English language Abstract of JP 9-282928.

\* cited by examiner

*Primary Examiner*—Jong-Suk (James) Lee
*Assistant Examiner*—Julie A. Shallenberger
(74) *Attorney, Agent, or Firm*—Greenblum & Bernstein, P.L.C

(57) ABSTRACT

In a discharge lamp lighting apparatus for lighting a lighting system using a discharge lamp, a housing used for containing a printed circuit board on which a discharge lamp lighting circuit is mounted is formed by resin molding. In order to put out wires connected to the printed circuit board from an inside to outside of the housing, protruding portions are protruded outward from upper end portions of a front face and a rear face of side walls of a base member which constitute the housing, and wire putting grooves are formed on upper faces of the protruding portions. Furthermore, reinforcing ribs are provided for coupling the protruding portions and portions of the side walls except the protruding portions so as to reinforce mechanical strength of the protruding portions by the reinforcing ribs.

17 Claims, 11 Drawing Sheets

DISCHARGE LAMP LIGHTING DEVICE AND ILLUMINATOR

TECHNICAL FIELD

The present invention relates to a discharge lamp lighting apparatus and a lighting system using the same.

BACKGROUND ART

As for a housing of a discharge lamp lighting apparatus, a metal housing has been used, conventionally. It, however, is necessary to provide a clearance between the housing and a printed circuit board or to provide an insulator between them for assuring the insulation between the housing and the printed circuit board on which a discharge lamp lighting circuit is mounted, and thereby, it is difficult to downsize the discharge lamp lighting apparatus. In recent years, it is required to downsize the discharge lamp lighting apparatus and a lighting system using the same, so that a housing made of a synthetic resin, which requires no insulation between the housing and the printed circuit board and enables to downsize and to reduce the manufacturing cost, is used.

An example of a discharge lamp lighting apparatus using a housing of synthetic resin is shown in FIG. 10 and FIG. 11. As shown in FIG. 11, the housing 101 of the discharge lamp lighting apparatus 100 is formed as a rectangular solid shape which is longer in cross direction. As shown in FIG. 11, the housing 101 is comprised of a base member 102 which is formed as a tubular box shape and has a rectangular bottom plate 121 and side walls 122 set up along entire circumference of an upper face of the bottom plate 121, and a cover member 103 for closing an upper opening of the base member 102. A printed circuit board 104, on which a discharge lamp lighting circuit is mounted, is contained in an inside of the base member 102.

Wire putting grooves 123, from which electric wires 105 electrically connected to the printed circuit board 104 are put out to outside of the housing 101, are provided on both of front and rear ends of the opening of the base member 102. Wire putting grooves 133 are provided on the cover member 103 at positions corresponding to the wire putting grooves 123 of the base member 102. When the base member 102 and the cover member 103 are coupled, through-holes for communicating the inside and the outside of the housing 101 are formed. For example, since guide protrusions 135 are formed on a lower face of the cover member 103, the base member 102 and the cover member 103 are coupled by engaging the guide protrusions 135 with recesses (not illustrated) provided on inner faces of the side walls 122 of the base member 102.

Hereupon, the circumferences of the wire putting grooves 123 are necessary to be formed that mechanical strength of them are made higher than that of the other sections. In order to increase the mechanical strength, it is considered that the side walls 122 of the base member 102 in the vicinity of the wire putting grooves 123 are made thicker. However, when the side walls 122 are made thicker, it may cause the occurrence of shrinkage cavity or welding in molding, so that the method for simply making the side walls 122 thicker cannot be adopted. Therefore, in the conventional housing 101, hollow protruding portions 124 bottoms of which are opened are provided for protruding from outer peripheral faces of the side walls 122, and the wire putting grooves 123 are formed on upper faces of the protruding portions 124. Protruded portions 134 are provided on the cover member 103 at positions corresponding to the protruding portions 124, and the wire putting grooves 133 of the cover member 103 are formed on the protruding portions 134. In this way, by providing the protruding portions 124, the side walls 122 are partially configured as overlap structure, so that the mechanical strength in the vicinity of the wire pulling grooves 123 can be increased without making the side walls 122 thicker.

By the way, a die for molding the above-mentioned base member 102 needs cores for forming the inner hollow cavities of the protruding portions 124, so that the configuration of the die becomes complex and the manufacturing cost thereof becomes higher. Furthermore, each core has a height at substantially the same level as that of the side walls 122, and has substantially the same width and thickness as those of the inner hollow cavity of the protruding portion 124, so that it is wider in width and higher in height in comparison with thickness. Therefore, mechanical strength of the core is lower than that of the other portion of the die, and the core may be replaced frequently, so that the life of the die becomes shorter. As a result, it causes the increase of the costs of the discharge lamp lighting apparatus and the lighting system using the same.

DISCLOSURE OF INVENTION

The present invention is conceived to solve the problems of the above-mentioned conventional example, and a purpose of the present invention is to provide a discharge lamp lighting apparatus which can reduce the manufacturing cost and a lighting apparatus using the same.

A discharge lamp lighting apparatus in accordance with an aspect of the present invention comprises a discharge lamp lighting circuit for lighting a discharge lamp, and a housing made of a synthetic resin for containing the discharge lamp lighting circuit therein.

The housing has a tubular shaped base member having a flat bottom plate and side walls set up along entire circumference of an upper face of the bottom plate, and a cover member for closing an upper opening of the base member.

The base member has a protruding portion formed to protrude outward from a part of the side wall, a wire putting portion formed on the protruding portion and communicating between an inside and an outside of the housing from which an electric wire electrically connected to the discharge lamp lighting circuit is put out, and a plurality of reinforcing ribs formed for coupling between a lower face of the protruding portion and portions of an outer face of the side walls except the protruding portion and for protruding outward from the side walls.

By such a configuration, the protruding portions, on which the wire putting portion is formed, is reinforced by the reinforcing ribs, so that a mechanical strength substantially the same as that in a case that the side walls are formed double can be ensured. On the other hand, in a die for resin molding the base member, a core, which is used for forming a hollow protruding portion and is wider in width and higher in height in comparison with thickness, becomes unnecessary. Therefore, a cost for manufacturing the die can be reduced, and the replacement of the core becomes unnecessary so that the life of the die can be extended. As a result, the manufacturing costs of the housing and the discharge lamp lighting apparatus using the same can be reduced.

Furthermore, a lighting system in accordance with an aspect of the present invention comprises a discharge lamp, the above-mentioned discharge lamp lighting apparatus for lighting the discharge lamp, a main body containing the discharge lamp lighting apparatus, and a socket electrically which is connected to the discharge lamp lighting apparatus and to which the discharge lamp is attached.

In this way, the lighting system is configured with using the discharge lamp lighting apparatus that the manufacturing cost thereof is reduced, so that the manufacturing cost of the lighting system can be reduced, too.

BEST MODE FOR CARRYING OUT THE INVENTION

FIRST EMBODIMENT

Figure 1:
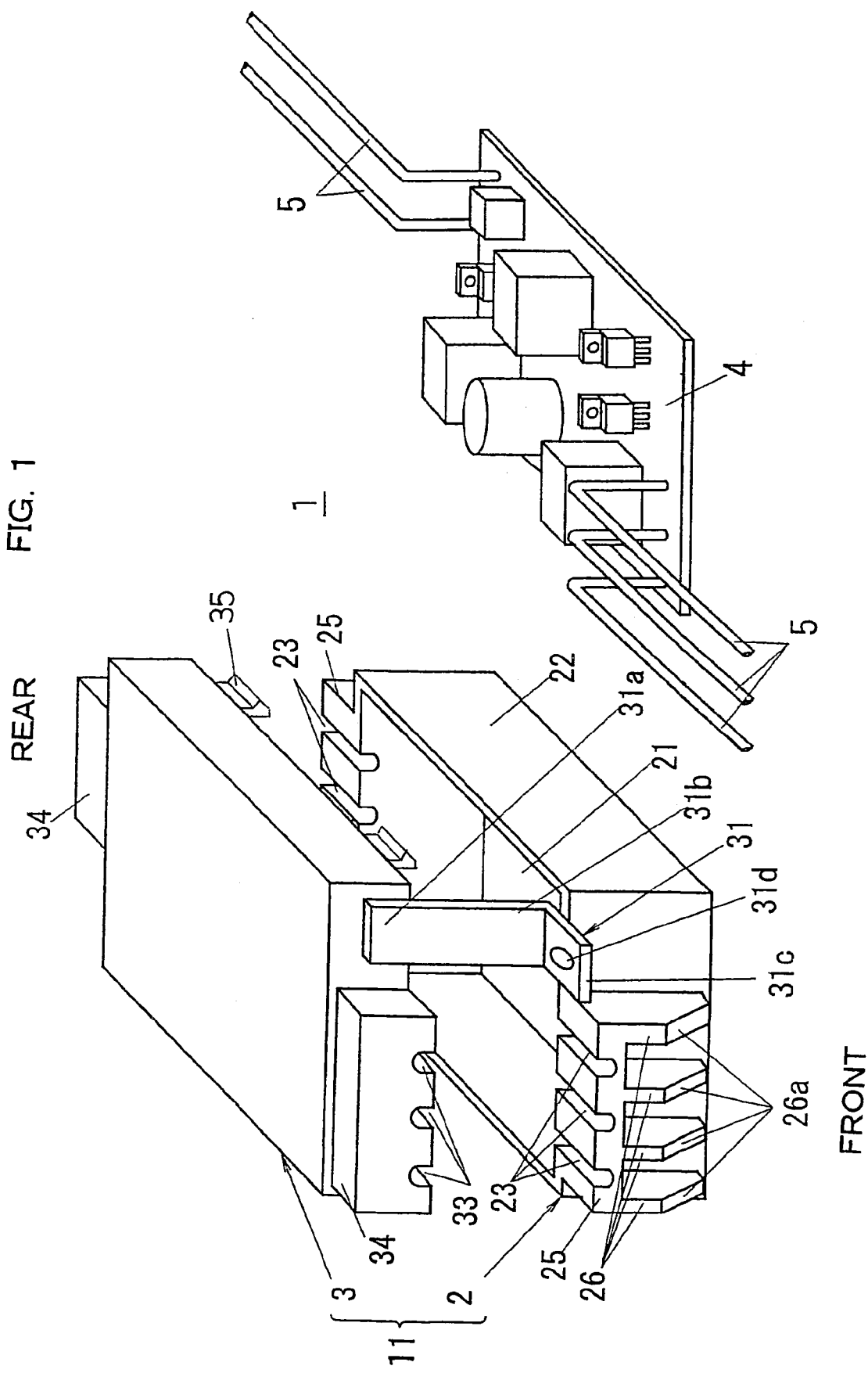
FIG. 1 is an exploded perspective view showing a configuration of a discharge lamp lighting apparatus in a first embodiment of the present invention.

A first embodiment of the present invention is described. FIG. 1 is an exploded perspective view showing a configuration of a discharge lamp lighting apparatus in a first embodiment. A housing 11 of the discharge lamp lighting apparatus 1 is formed as a rectangular solid shape which is longer in cross direction similar to the conventional discharge lamp lighting apparatus 100 shown in FIG. 10 and FIG. 11. As shown in FIG. 1, the housing 11 is comprised of a base member 2 which is formed as a tubular box shape and has a rectangular bottom plate 21 and side walls 22 set up along entire circumference of an upper face of the bottom plate 21, and a cover member 3 for closing an upper opening of the base member 2. A printed circuit board 4, on which a discharge lamp lighting circuit is mounted, is contained in an inside of the base member 2.

As shown in FIG. 1, protruding portions 25 are formed on a front face and a rear face of the side walls 22 of the base member 2 for protruding outward from upper edges thereof. Furthermore, wire putting grooves 23, from which electric wires 5 electrically connected to the printed circuit board 4 are put out to outside of the housing 11, are provided on the protruding portions 25.

Protruding portions 34 are formed on the cover member 3 at positions corresponding to the protruding portions 25 of the base member 2, and wire putting grooves 33 are provided at positions corresponding to the wire putting grooves 23, too. Since guide protrusions 35 are formed on a lower face of the cover member 3, the base member 2 and the cover member 3 are coupled by engaging the guide protrusions 35 with inner faces of the side walls 22 of the base member 2. When the base member 2 and the cover member 3 are coupled, through-holes for communicating an inside and an outside of the housing 11 are formed.

Reinforcing ribs 26 are provided below each protruding portion 25 protruding from the side walls 22 of the base member 2 for coupling between a lower face of each protruding portion 25 and portions of an outer face of the side walls 22 except the protruding portion 25, so that strength of the protruding portion 25 is ensured. A plurality of (four in the figure) of the reinforcing ribs 26 is arranged at a predetermined distance below each protruding portion 25. Furthermore, a slanted face 26a is provided on a lower end portion of a front face of each reinforcing rib 26 so that protruding dimension from the side wall 22 becomes smaller approaching to the lower end. By providing such a slant face 26a, the lower end of the reinforcing rib 26 becomes obtuse angle, so that handling of the base member 2 becomes easier. In addition, the protruding dimension of the protruding portion 25 from the side wall 22 is not limited in particular, but it is illustrated a little larger than ½ (more than a half) of the height of the side walls 22 of the base member 2 in FIG. 1.

Figure 2:
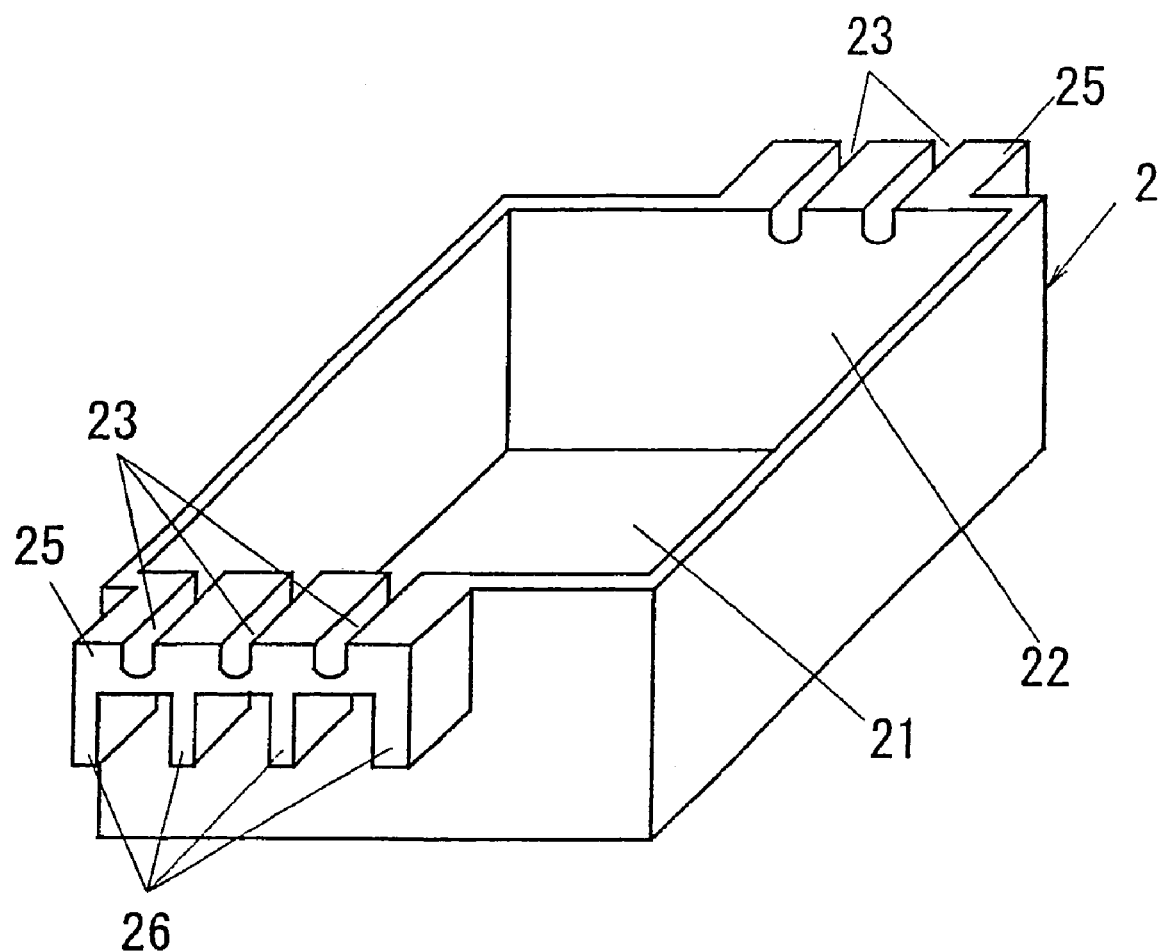
FIG. 2 is a perspective view showing another constitutional example of a base member in the first embodiment.

FIG. 2 shows another constitutional example of the base member 2. Even when the protruding dimension of the reinforcing rib 26 from the side wall 22 is even and the slant face 26a at lower portion is omitted as shown in FIG. 2, substantially the same effect can be obtained. Although the mechanical strength of the protruding portions 25 by the reinforcing ribs 26 are reduced a little in comparison with the case shown in FIG. 1, spaces are formed below the reinforcing ribs 26a. Therefore, degree of freedom when this discharge lamp lighting apparatus 1 is attached to a lighting system can be increased, so that the lighting system using the discharge lamp lighting apparatus 1 can be downsized. Furthermore, by increasing a number of reinforcing ribs 26 or by thickening the reinforcing ribs 26, the mechanical strength of the protruding portion 25 can be increased.

By the way, there is an occasion that such a discharge lamp lighting apparatus needs fixing portion to be fixed on the lighting system. Therefore, in the example shown in FIG. 1, fixing portions 31, which are used for fixing the discharge lamp lighting apparatus on a lighting system, are provided on a front face and a rear face of the cover member 31, respectively. Each fixing portions 31 is configured by a base portion 31a provided for protruding outward from the front face or the rear face of the cover member 31, an arm portion 31b protruded downward from the base portion 31a by substantially the same level as the height of the side walls 22 of the base member 2, and a portion to be fixed 31c further protruded frontward or rearward from the arm portion 31b. A screw penetration hole 31d through which a screw is penetrated is provided on the portion to be fixed 31c. In this way, by providing the fixing portions 31 on the cover member 3, when the housing 11 is fixed on the lighting system, the cover member 3 is directly fixed on a main body of the lighting system. Simultaneously, the base member 2 is held between the cover member 3 and the main body of the lighting system, so that the base member 2 is fixed on the main body of the lighting system, consequently. As a result, even when an impact is applied to the main body of the lighting system, a possibility that the discharge lamp lighting apparatus is fallen from the main body of the lighting system or damaged can be reduced. According to a structure for fixing the discharge lamp lighting apparatus 1 on the lighting system, the fixing portions 31 may not be provided like the conventional discharge lamp lighting apparatus 100 shown in FIG. 10 and FIG. 11.

Figure 3A:
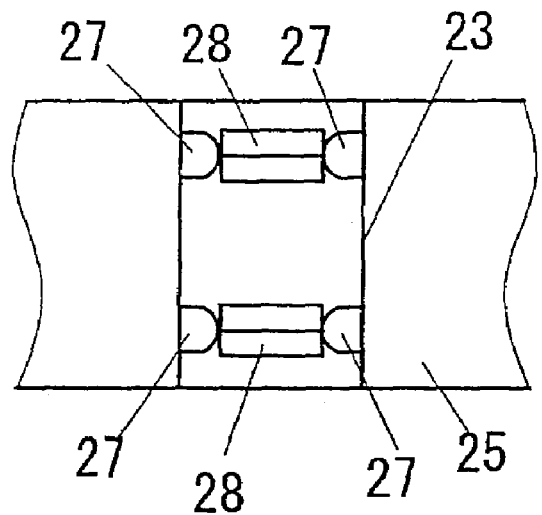
FIG. 3A, FIG. 3B and FIG. 3C are a plan view, a front view and a sectional view parallel to a longitudinal direction of a wire pulling groove and perpendicular to a widthwise direction thereof respectively showing the wire pulling groove in detail.
Figure 3B:
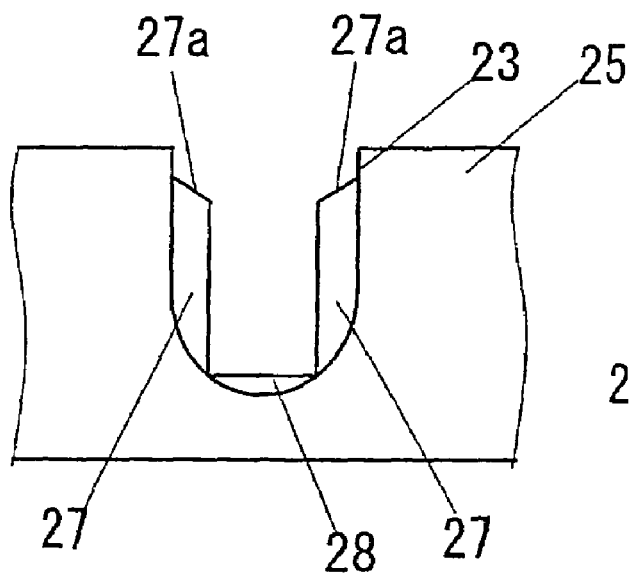
Figure 3C:
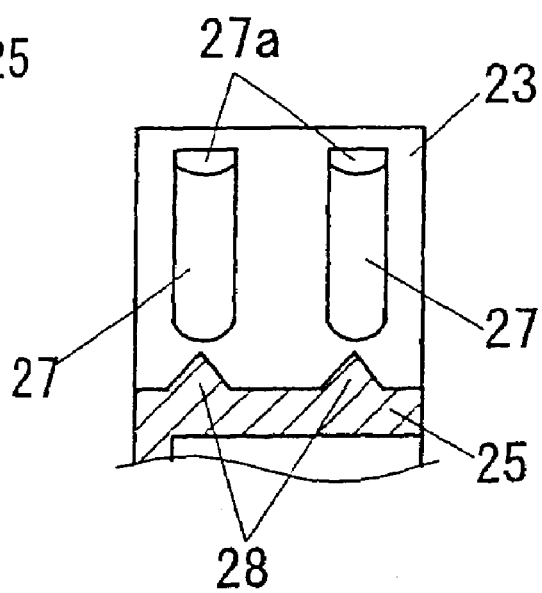

Subsequently, a structure of the wire putting groove 23 is described with reference to FIG. 3A, FIG. 3B and FIG. 3C. As shown in the figures, a plurality (two pairs in the figures) of ribs 27 is respectively provided for protruding from inner walls at both of right and left sides of the wire putting grooves 23 so that cross-sectional shape parallel to an upper opening plane of the wire putting groove 23 becomes hemicycle. A distance between two ribs 27 opposing each other is set to be substantially the same level as but a little larger than a diameter of a wire 5. When the printed circuit board 4 is mounted on the base member 2, the wires 5 can be held between the ribs 27 at right and left sides, so that the assembly workability is increased. Furthermore, a slant face 27a is provided on an upper end of each rib 27 so that protruding dimension is gradually made larger approaching to downward, so that the wire 5 can easily be held between the ribs 27. Still furthermore, a plurality (two in the figure) of protrusions 28 is provided on a bottom of the wire putting groove 23 having a substantially triangle cross-sectional shape in a direction parallel to the longitudinal direction and perpendicular to the widthwise direction of the wire putting groove 23. In this way, by providing the protrusions 28, even when the wire 5 is pulled out or pushed in from the outside, the wire 5 may be hooked with the protrusions 28, so that stress applied to a connecting portion of the wire 5 and the printed circuit board 4 can be reduced and the breaking of the wire can be prevented.

Figure 10:
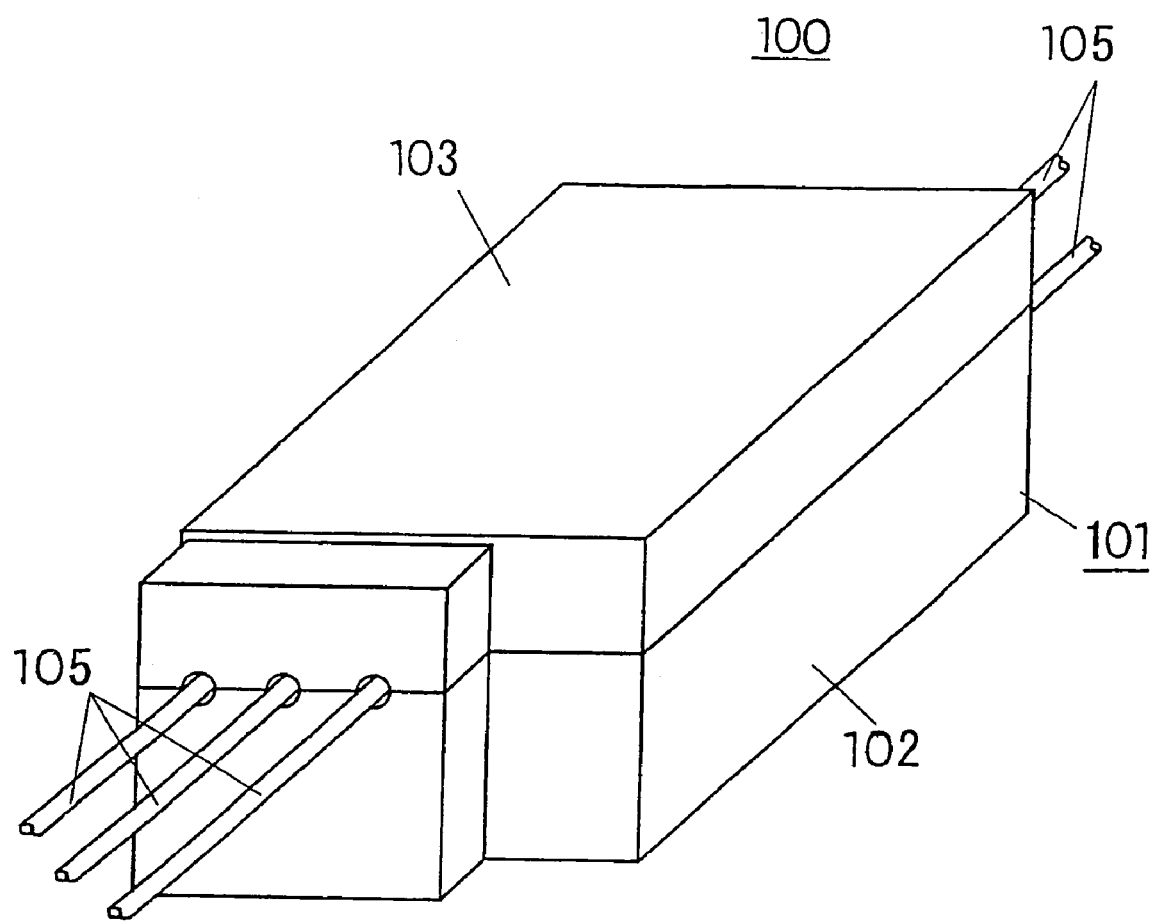
FIG. 10 is a perspective view showing an appearance of a conventional discharge lamp lighting apparatus using a housing made of resin.
Figure 11:
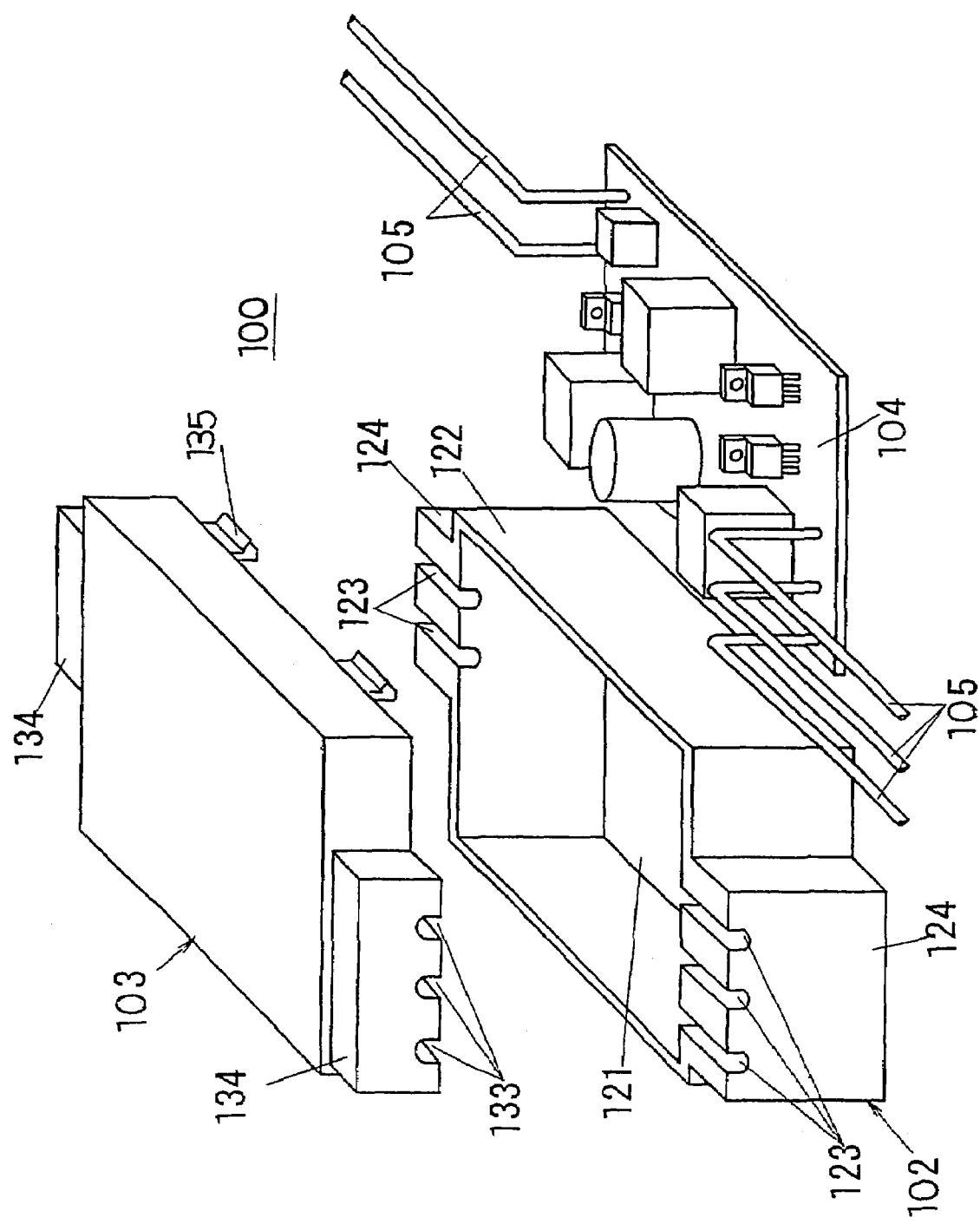
FIG. 11 is an exploded perspective view showing a configuration of the above-mentioned conventional discharge lamp lighting apparatus.

According to the configuration shown in FIG. 1 or FIG. 2, the protruding portions 25 are protruded from the side walls 22 of the base member 2, the wire putting grooves 23 are provided on the upper faces of the protruding portions 25 and the protruding portions 25 are reinforced by the reinforcing ribs 26, so that mechanical strength substantially the same as that of the conventional base member 102 provided the hollow protruding portions 124 protruded from the outer peripheral faces of the side walls 122 shown in FIG. 10 and FIG. 11 can be ensured. Therefore, in a die for resin molding the base member 2 in this embodiment, a core for forming the hollow protruding portion becomes unnecessary. As a result, a manufacturing cost of the die can be reduced and the life of the die can be extended, so that the costs of the housing 11 and the discharge lamp lighting apparatus 1 using the same can be reduced.

Figure 4A:
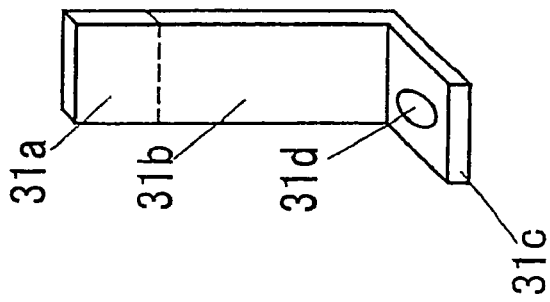
FIG. 4A is a perspective view showing an example of a core which is attached to a die used for molding a cover member.
Figure 4B:
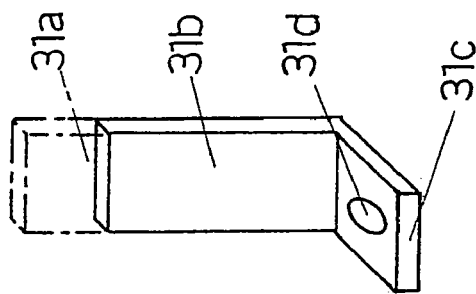
FIG. 4B is a perspective view showing another example of a core which is attached to a die used for molding a cover member.
Figure 4C:
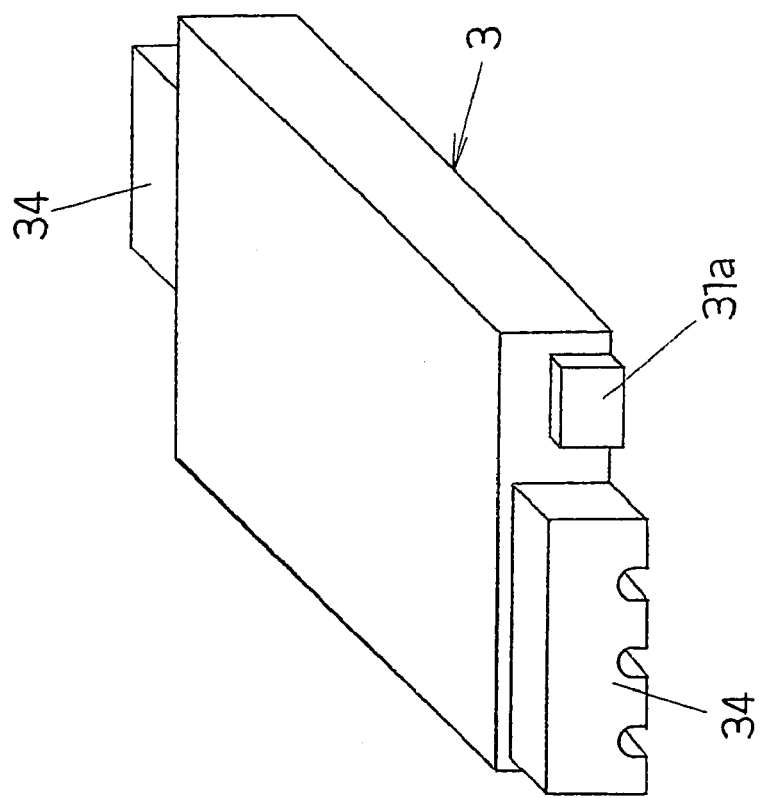
FIG. 4C is a perspective view showing an appearance shape of a cover member molded by a die to which the core shown in FIG. 4B is attached.

Furthermore, the fixing portions 31 are provided on the cover member 31 in the constitutional example shown in FIG. 1. It, however, is possible to manufacture a cover member having no fixing portion 31, for example shown in FIG. 11 with using the same die by attaching cores each having a shape corresponding to the fixing portion 31, for example, shown in FIG. 4A. Alternatively, by preparing a plurality of cores respectively having different shapes and attaching the cores arbitrarily to the die, a plurality of kinds of cover members in which the positions and shapes of the fixing portions are different can be manufactured by the same die. Still furthermore, by attaching cores corresponding to the arm portion 31b of the fixing portion 31 shown in FIG. 4B, a cover member in which only the base portions 31a are formed on the front end face and the rear end face of the cover member 3 as shown in FIG. 4C can be manufactured. In such a case, no parting line due to the core of the die appears on surfaces of the cover member 3, so that quality of an appearance is increased.

Figure 5:
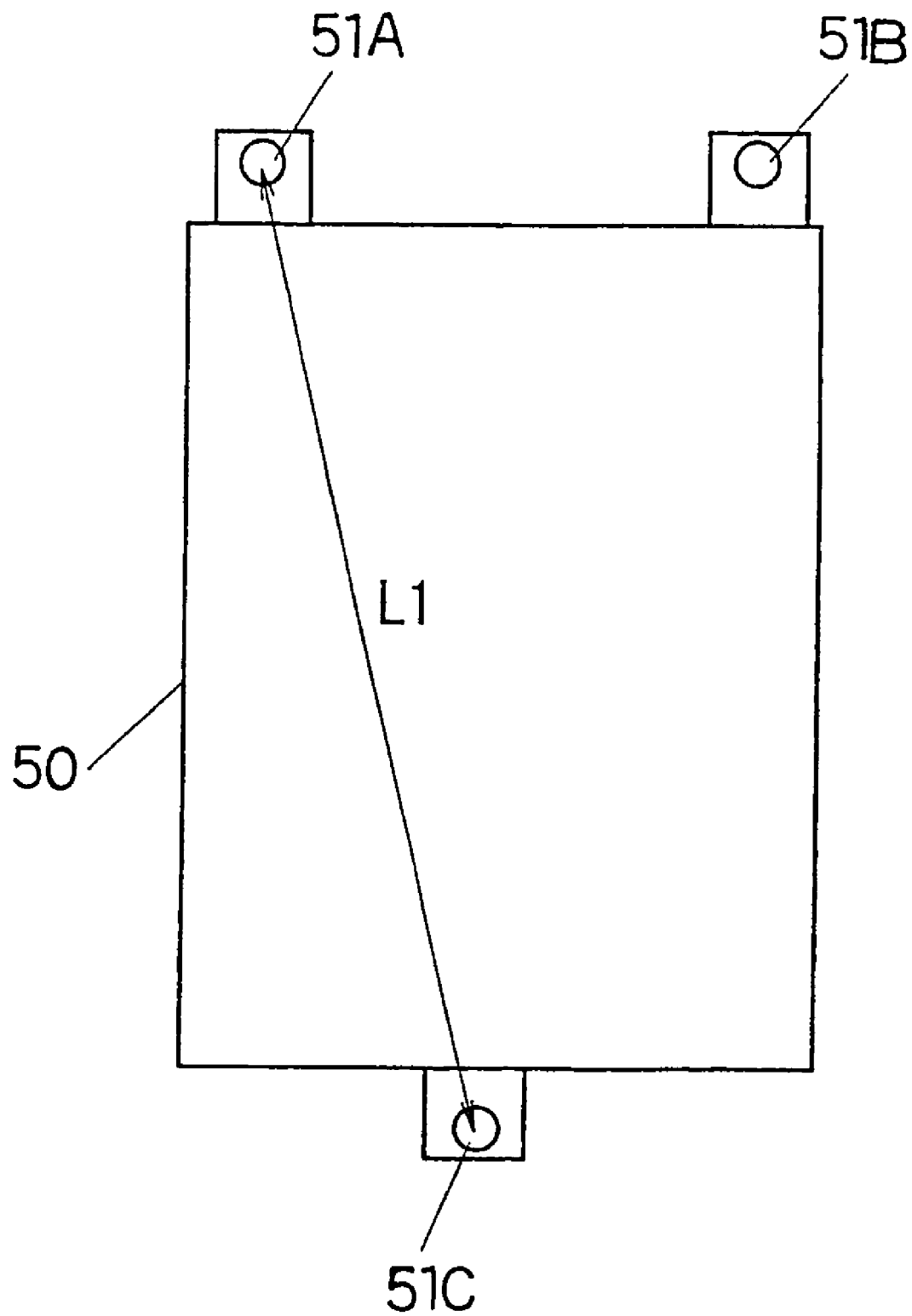
FIG. 5 is a plan view showing a positional relation between a housing of a conventional discharge lamp lighting apparatus and fixing portions thereof.

Subsequently, positions of the fixing portions 31 provided on the housing 11 of the discharge lamp lighting apparatus 1 are described. FIG. 5 shows a housing 50 of a discharge lamp lighting apparatus which is conventionally supplied. Fixing potions 51A, 51B and 51c, into which screws for fixing the housing 50 on a lighting system are inserted, are provided at, for example, both side of a rear face and a center of a front face of the rectangular solid shaped housing 50. A distance L1 between each of the fixing portions 51A and 51B provided on the rear face and the fixing portion 51C provided on the front face are in a range of, for example, 135 mm to 145 mm.

Figure 6:
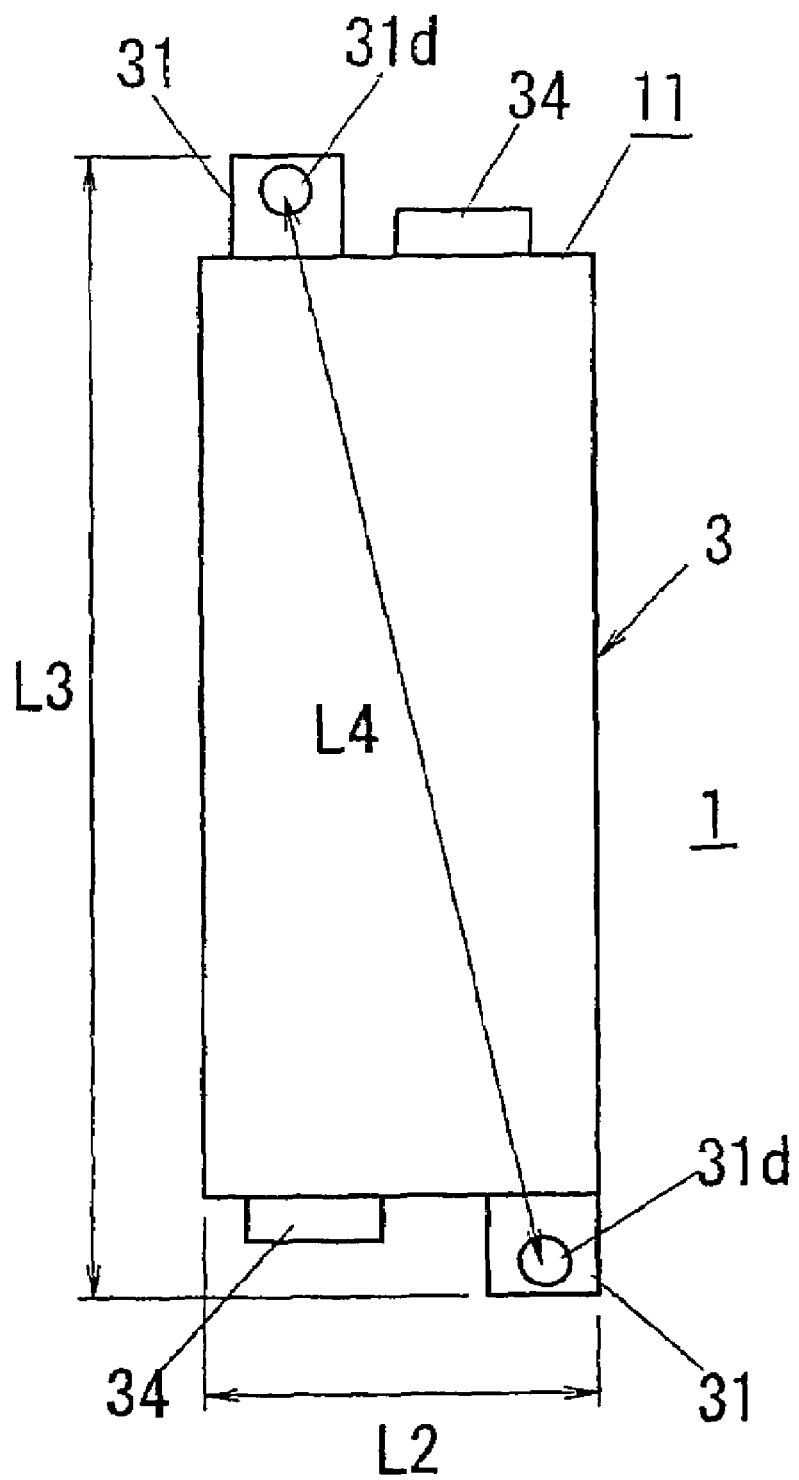
FIG. 6 is a plan view showing a positional relation between a housing of a discharge lamp lighting apparatus and fixing portions thereof in accordance with the first embodiment.

FIG. 6 shows a housing 11 of a discharge lamp lighting apparatus 1 in this embodiment which is downsized by integration of the discharge lamp lighting circuit, and so on. A width L2, a length L3 and a height (in normal direction of a paper sheet of FIG. 6) are respectively set in ranges of 40 mm to 45 mm, 130 mm to 140 mm, and 30 mm to 40 mm, and a distance L4 between two fixing portions 31 are set to be 135 mm to 145 (SIC: mm is missed). By setting the dimensions in this manner, the discharge lamp lighting apparatus of this embodiment can be attached to the lighting system while maintaining compatibility with the fixing positions of the conventional discharge lamp lighting apparatus.

Figure 7:
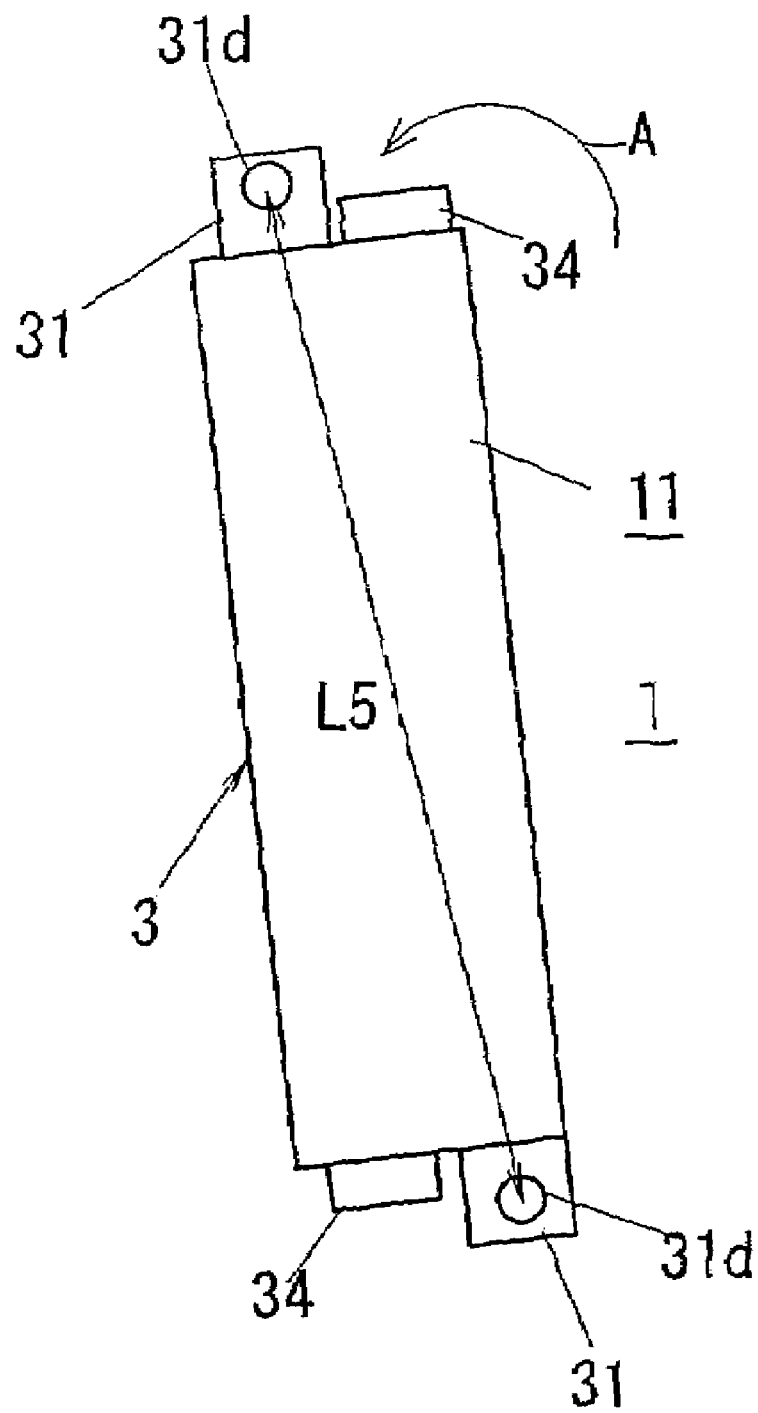
FIG. 7 is a plan view showing a positional relation between a housing of another discharge lamp lighting apparatus and fixing portions thereof in accordance with the first embodiment.

In addition, the dimensions of the housing 11 are not limited to the above-mentioned specific examples. When the fixing portions 31 are provided on both end faces of the housing 11 and the distance between the fixing portions 31 is in a range of 135 mm to 145 mm, it is possible to be fixed at the fixing positions of the conventional discharge lamp lighting apparatus. For example, as shown in FIG. 7, when a length L5 between the fixing portions 31 is in the range of 135 mm to 145 mm, although the housing 11 is an elongate shape 1 than that shown in FIG. 6, it is possible to be fixed by rotating in a direction shown by arrow A with respect to the fixing positions of the conventional housing.

SECOND EMBODIMENT

Figure 8:
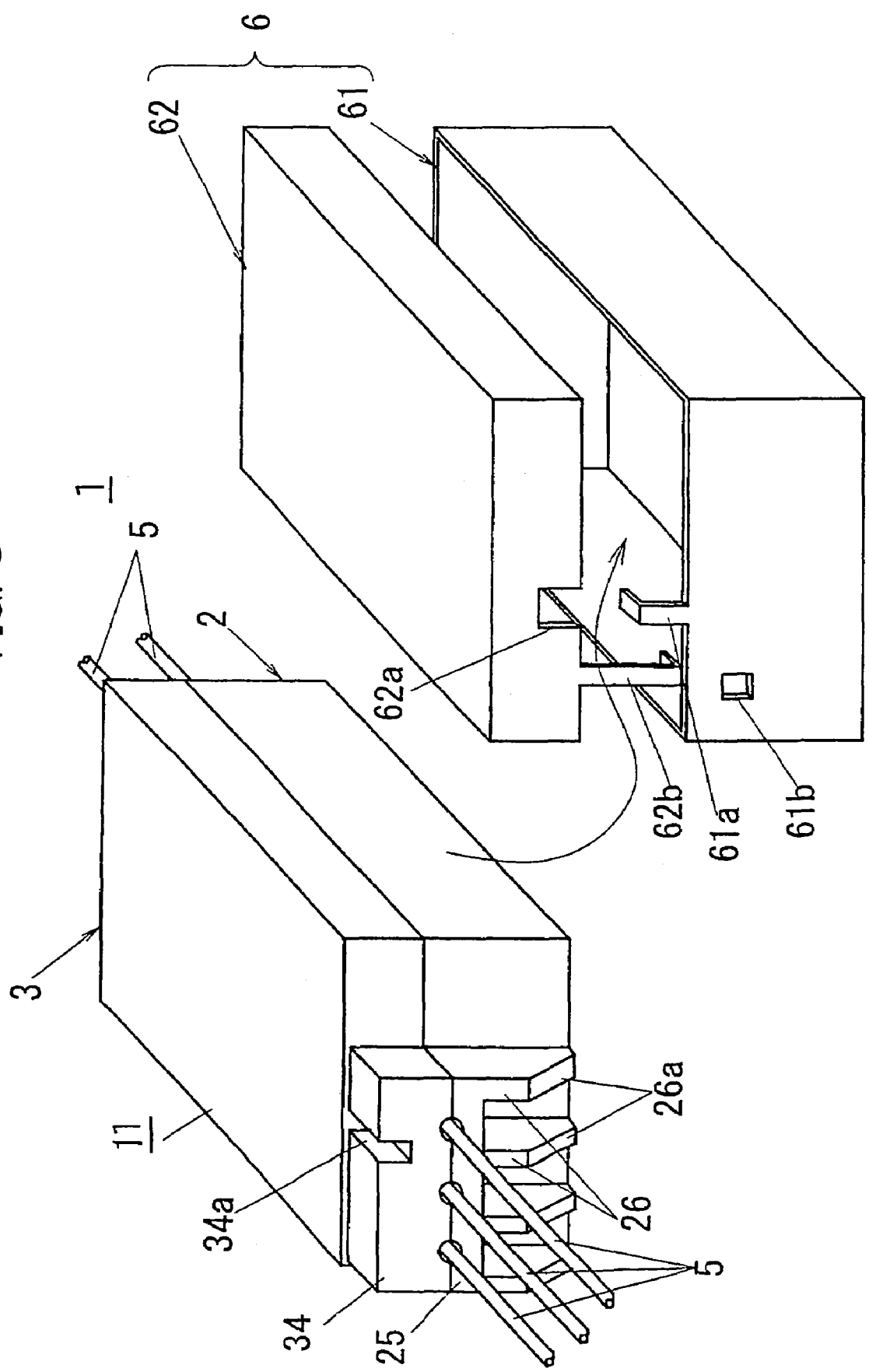
FIG. 8 is an exploded perspective view showing a configuration of a discharge lamp lighting apparatus in accordance with a second embodiment of the present invention.

Subsequently, a second embodiment of the present invention is described. FIG. 8 is an exploded perspective view showing a configuration of a discharge lamp lighting apparatus in the second embodiment. As shown in FIG. 8, the discharge lamp lighting apparatus 1 of the second embodiment is configured that the housing 11 is covered by a metal cover 6 comprised of a first cover piece 61 and a second cover piece 62. The fixing portions 31 are not formed on the cover member 3. Other configurations are substantially the same as those in the above first embodiment.

The first cover piece 61 is configured to be a rectangular solid top face of which is opened so as to cover the base member 2. The second cover piece 62 is configured to be a rectangular solid bottom face of which is opened so as to cover the cover member 3. Hooking portions 61a, which are protruded upward and front ends of which are inwardly bent, are respectively provided on an upper edge of a front face and an upper edge of a rear face of the first cover piece 61. On the other hand, engaging recesses 34a, which are opened at front ends thereof, are provided on upper faces of the protruding portions 34 of the cover member 3. By engaging the front ends of the hooking portions 61a with the engaging recesses 34a, the housing 11 and the first cover piece 61 are unified.

Hooking portions 62a, which are protruded downward and front ends of which are inwardly bent, are respectively provided on a lower edge of a front face and a lower edge of a rear face of the second cover piece 62. Furthermore, cuttings 62a are formed on the front face and the rear face of the cover piece 62 at positions corresponding to the hooking portions 61a of the first cover piece 61 so as to prevent the interference of the hooking portions 61a of the first cover piece 61. Similarly, engaging holes 61b, to which the front ends of the hooking portions 62b of the second cover piece 62, are provided on the front face and the rear face of the first cover piece 61 at positions corresponding to the hooking portions 62b of the second cover piece 62.

By engaging the hooking portions 62b of the second cover piece 62 with the engaging holes 61b of the first cover piece 61, the first cover piece 61 and the second cover piece 62 are coupled. Under a condition that the first cover piece 61 and the second cover piece 62 are coupled, a clearance is formed between an upper end of a chassis portion of the first cover piece 61 and a lower end of a chassis portion of the second cover piece 62, so that the wires 5 are put out from the clearance. Furthermore, the hooking portions 61a and the engaging holes 61b of the first cover piece 61 and the cuttings 62a and the hooking portions 62b of the second cover piece 62, which constitute engaging portions of the first cover piece 61 and the second cover piece 62, are disposed in the vicinity of the wire putting grooves 23.

By such a configuration, the second cover piece 62 is not overlapped with the first cover piece 61 except the hooking portions 62b, so that it is possible to upsize the metal cover 6. Furthermore, the housing 11 and the discharge lamp lighting apparatus therein are covered by the metal cover 6, so that electromagnetic wave can be shielded, and the inner discharge lamp lighting apparatus can be protected from the impact, or the like. Still furthermore, since the required dimensional accuracy of a portion in the vicinity of the wire putting grooves 23 is relatively lower than that of the other portions, even when the engaging portions of the first cover piece 61 and the second cover piece 62 are provided in the vicinity of the wire putting grooves 23, the possibility that it may cause an impediment of wiring operation of the wires is lower. Still furthermore, degree of upsizing the discharge lamp lighting apparatus 1 due to the hooking portion 62b of the second cover piece 62 overlaps with the first cover piece 61 is severalfold of a board thickness of the second cover piece 62, so that the discharge lamp lighting apparatus 1 is never upsized extremely.

THIRD EMBODIMENT

Figure 9:
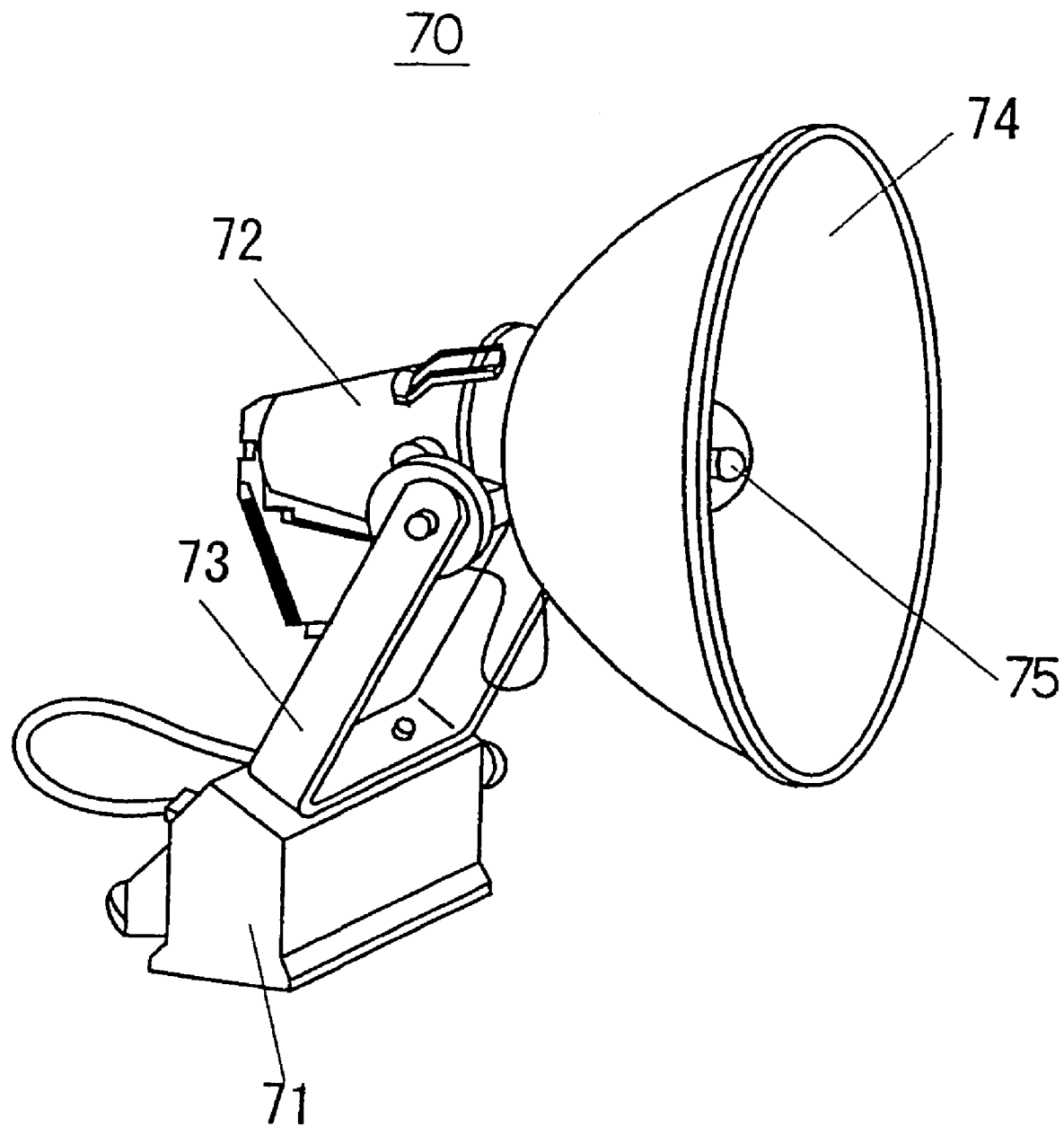
FIG. 9 is a perspective view showing an appearance of a lighting system in accordance with a third embodiment of the present invention.

Subsequently, a third embodiment of the present invention is described. FIG. 9 shows a lighting system using the discharge lamp lighting apparatus in accordance with the present invention. As shown in FIG. 9, the lighting system 70 in accordance with the third embodiment is comprised of a main body 71 into which the discharge lamp lighting apparatus 1 in accordance with the first or second embodiment is contained, a lighting body 72 having a socket (not illustrated) to which a discharge lamp 75 is attached, an arm 73 which is coupled to the main body 71 and holds the lighting body 72 rotatable with respect to the main body 71, a discharge lamp cover 74 coupled with the lighting body 72 and having a reflector for distributing light of the discharge lamp 75, and so on.

By such a configuration, since the discharge lamp lighting apparatus that the manufacturing cost thereof is reduced is used, the manufacturing cost of the lighting system itself can be reduced.

OTHER MODIFIED EXAMPLES

In the above-mentioned embodiments, although the housing 11 is formed as a rectangular solid shape, the present invention is not limited to this. For example, the housing 11 can be formed as a tubular shape or another shape. Furthermore, the shape of the reinforcing ribs 26 of the base member 2 is not limited to the illustrated ones, it may be another shape. Still furthermore, the arrangement number of the reinforcing ribs 26 is not limited to the illustrated number.

Furthermore, the wire putting grooves 33 are provided on the protruding portions 34 of the cover member 3. However, the wire putting grooves on the cover member 3 can be omitted when the wires 5 are completed contained in the wire putting grooves 23 provided on the protruding portions 25 of the base member 2. Still furthermore, as for the wire putting portion, a structure except the wire putting groove can be adopted. Still furthermore, the protruding portions 34 of the cover member 3 in itself can be omitted.

Furthermore, although the distance between two ribs 27 formed on the wire putting groove so as to oppose each other is set to be substantially the same as but a little larger than the outer diameter of the wire 5, the present invention is not limited to this. It is possible to configure that the distance between two ribs 27 opposing each other are formed a little smaller than the outer diameter of the wire 5 so as to nip the wire 5 between two ribs 27 in an extent that an insulation membrane of the wire 5 is not damaged. Still furthermore, the cross-sectional shape of the rib 27 is not limited to substantially the hemisphere, and it may be substantially a triangular shape, or the like. Similarly, the cross-sectional shape of the protrusion 28 on the bottom of the wire putting groove 23 is not limited to substantially the triangular shape, and it may be substantially the hemisphere, or the like.

Furthermore, although the protruding dimension of the protruding portion 25 of the base member 2 is set to be equal to ore larger than ½ of the height of the side walls 22, the present invention is not limited to this. For example, by carrying out a modification such as increasing the thickness or the number of the reinforcing ribs 26, it may be less than ½ of the height on the side walls 22, if the mechanical strength of the protruding portions 25 can be ensured.

This application is based on Japanese patent application 2003-181147 filed in Japan, the contents of which are hereby incorporated by references of the specification and drawings of the above-mentioned patent application.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

INDUSTRIAL APPLICABILITY

As mentioned above, according to the present invention, a manufacturing cost of a die for resin molding a housing of a discharge lamp lighting apparatus, especially a base member can be reduced, and life of the die can be extended, so that the manufacturing cost of the housing, consequently, the manufacturing costs of the discharge lamp lighting apparatus and the lighting system using the same can be reduced.

The invention claimed is:

1. A discharge lamp lighting apparatus comprising a discharge lamp lighting circuit for lighting a discharge lamp, and a housing of synthetic resin, the housing having a base member and a cover member which form a cavity within which the discharge lamp lighting circuit is received, the base member comprising:
a flat rectangular bottom plate and four side walls which extend perpendicularly from the bottom plate along each side of the bottom plate;
at least a protruding portion which is provided on a part of a upper end of one of the side walls and is configured to protrude outward;
a wire receiving portion which is provided on a surface of the protruding portion and is configured to communicate between an inside and an outside of the housing, and on which at least an electric wire, electrically connected to the discharge lamp lighting circuit, is received; and,
a plurality of reinforcing ribs which extend between a surface of the protruding portion, other than the surface on which the wire receiving portion is provided, and an outer surface of the side wall on which the protruding portion is provided.

2. The discharge lamp lighting apparatus in accordance with claim 1, wherein a distance by which the protruding portion of the base member protrudes outward from the side wall is equal to or larger than ½ of a height of the side wall from the bottom plate.

3. The discharge lamp lighting apparatus in accordance with claim 1, wherein a slanted face is provided in a vicinity of a lower end of each of the reinforcing ribs so that a distance that the reinforcing rib protrudes outward from the outer face of side wall decreases with an increase in distance from the protruding portion.

4. The discharge lamp lighting apparatus in accordance with claim 1, wherein the wire receiving portion has at least a groove which is provided on a surface of the protruding portion opposite to the reinforcing ribs and that communicates with the cavity of the housing and into which the electric wire, electrically connected to the discharge lamp lighting circuit, is received and at least a pair of ribs, each of the pair of ribs has a substantially semicircular shape in a section parallel to the face of the protruding portion, the pair of ribs positioned opposing to each other on an inner face of the groove, and configured to pinch an electric wire therebetween.

5. The discharge lamp lighting apparatus in accordance with claim 1, wherein the wire receiving portion has at least a groove which is provided on a surface of the protruding portion opposite to the reinforcing ribs, that communicates with the cavity of the housing and within which an electric wire, electrically connected to the discharge lamp lighting circuit, is received and
a plurality of protrusions are provided on bottom of the groove, each protrusion having a substantially triangular shape in a section parallel to a longitudinal direction of the protrusion and extending perpendicular to a widthwise direction of the groove, the protrusions bring configured to hook the electric wire when the electric wire is pulled out or pushed in from outside of the housing.

6. The discharge lamp lighting apparatus in accordance with claim 5, wherein the cover member has a protruding portion configured to overlap with the face of the protruding portion of the base member on which the wire receiving portion is provided.

7. The discharge lamp lighting apparatus in accordance with claim 1, wherein at least two fixing portions, by which the housing is fixed to a lighting system, are provided so to protrude outward from lower ends of at least two of the side walls of the base member, other than the upper end on which the protruding portion is formed.

8. The discharge lamp lighting apparatus in accordance with claim 7, wherein the cover member has an arm portion which is configured to protrude toward the base member from the cover member, along a side wall of the base member, the fixing portion being configured to protrude outward from an end of the arm portion and has a screw penetration hole provided on the fixing portion.

9. The discharge lamp lighting apparatus in accordance with claim 1, further comprising a metal cover, including a plurality of cover pieces, is configured to cover the housing
each cover piece has an engaging portion which is configured to be engaged with at least another one of a cover piece and a housing in a vicinity of the wire receiving portion.

10. The discharge lamp lighting apparatus in accordance with claim 9, wherein each cover piece is configured so as not to overlap with another cover piece except at a portion in a vicinity of the engaging portion.

11. A lighting system comprising a discharge lamp, a discharge lamp lighting apparatus for lighting the discharge lamp, a main body containing the discharge lamp lighting apparatus, and a socket which is electrically connected to the discharge lamp lighting apparatus and to which the discharge lamp is attached, wherein
the discharge lamp lighting apparatus further comprises a discharge lamp lighting circuit for lighting the discharge lamp, and a housing of synthetic resins, the housing having a base member and a cover member which form a cavity within which the discharge lamp lighting circuit is received,
the base member comprising:
a flat rectangular bottom plate and four side walls which extend perpendicularly from the bottom plate along each side of the bottom plate;
at least a protruding portion which is provided on a part of a upper end of one of the side walls and is configured to protrude outward;
a wire receiving portion which is provided on a surface of the protruding portion and is configured to communicate between an inside and an outside of the housing, and on which at least an electric wire, electrically connected to the discharge lamp lighting circuit, is received,
a plurality of reinforcing ribs which extend between a surface of the protruding portion, other than the surface on which the wire receiving portion is provided, and an outer surface of the side wall on which the protruding portion is provided.

12. The discharge lamp lighting apparatus in accordance with claim 2, wherein a slanted face is provided in a vicinity of a lower end of each of the reinforcing ribs so that a distance that the reinforcing rib protrudes outward from the outer face of the side wall decreases with an increase in distance from the protruding portion.

13. The discharge lamp lightning apparatus in accordance with claim 4, wherein
a plurality of protrusions are provided an a bottom of the groove, each protrusion having a substantially triangular shape in a section parallel to a longitudinal direction and the protrusion extending perpendicular to a widthwise direction of the groove, the protrusions being configured to hook the electric wire when the electric wire is pulled out or pushed in from outside of the housing.

14. The discharge lamp lighting apparatus according to claim 1, the protruding portion having a shape distinct from a shape of the side wall from which the protruding portion protrudes.

15. The lighting system according to claim 11, the protruding portion having a shape distinct from a shape of the side wall from which the protruding portion protrudes.

16. The discharge lamp lighting apparatus according to claim 1, the plurality of reinforcing ribs extending from a surface of the protruding portion opposite to the surface of the protruding portion on which the wire receiving portion is provided.

17. The lighting system according to claim 11, the plurality of reinforcing ribs extending from a surface of the protruding portion opposite the to the surface of the protruding portion on which the wire receiving portion is provided.

* * * * *